(12) United States Patent
Grieb et al.

(10) Patent No.: US 10,153,363 B2
(45) Date of Patent: Dec. 11, 2018

(54) TRANSISTOR HAVING HIGH ELECTRON MOBILITY AND METHOD OF ITS MANUFACTURE

(71) Applicant: Robert Bosch GmbH, Stuttgart (DE)

(72) Inventors: Michael Grieb, Renningen-Malmsheim (DE); Simon Jauss, Esslingen (DE); Stephan Schwaiger, Leonberg (DE)

(73) Assignee: ROBERT BOSCH GMBH, Stuttgart (DE)

(*) Notice: Subject to any disclaimer, the term of this patent is extended or adjusted under 35 U.S.C. 154(b) by 0 days.

(21) Appl. No.: 15/738,464

(22) PCT Filed: Apr. 27, 2016

(86) PCT No.: PCT/EP2016/059386
§ 371 (c)(1),
(2) Date: Dec. 20, 2017

(87) PCT Pub. No.: WO2017/001082
PCT Pub. Date: Jan. 5, 2017

(65) Prior Publication Data
US 2018/0182880 A1    Jun. 28, 2018

(30) Foreign Application Priority Data

Jun. 29, 2015  (DE) .......................... 10 2015 212 048

(51) Int. Cl.
*H01L 29/778*  (2006.01)
*H01L 29/417*  (2006.01)
(Continued)

(52) U.S. Cl.
CPC .... *H01L 29/7787* (2013.01); *H01L 29/41766* (2013.01); *H01L 29/42376* (2013.01);
(Continued)

(58) Field of Classification Search
CPC ........... H01L 29/7787; H01L 29/41766; H01L 29/66522; H01L 29/66462;
(Continued)

(56) References Cited

U.S. PATENT DOCUMENTS

2010/0097105 A1    4/2010  Morita et al.
2010/0155720 A1*   6/2010  Kaneko ............... H01L 29/2003
                                                         257/43
(Continued)

FOREIGN PATENT DOCUMENTS

DE    102011000911 A1    9/2011
DE    112010004021 T5    6/2013
(Continued)

OTHER PUBLICATIONS

International Search Report dated Sep. 22, 2016, of the corresponding International Application PCT/EP2016/059386 filed Apr. 27, 2016.

*Primary Examiner* — Selim Ahmed
(74) *Attorney, Agent, or Firm* — Norton Rose Fulbright US LLP; Gerard Messina

(57) ABSTRACT

A method for manufacturing a transistor having high electron mobility, encompassing a substrate having a heterostructure, in particular an AlGaN/GaN heterostructure, having the steps of: generation of a gate electrode by patterning a semiconductor layer that is applied onto the heterostructure, the semiconductor layer encompassing, in particular, polysilicon; application of a passivating layer onto the semiconductor layer; formation of drain regions and source regions by generation of first vertical openings that extend at least into the heterostructure; generation of ohmic contacts in the drain regions and in the source regions by partly filling the first vertical openings with a first metal at least to the height of the passivating layer; and application of a second (Continued)

metal layer onto the ohmic contacts, the second metal layer projecting beyond the passivating layer.

13 Claims, 8 Drawing Sheets

(51) Int. Cl.
  H01L 29/49      (2006.01)
  H01L 29/66      (2006.01)
  H01L 29/47      (2006.01)
  H01L 29/423     (2006.01)
  H01L 29/20      (2006.01)
  H01L 29/205     (2006.01)

(52) U.S. Cl.
  CPC .......... *H01L 29/47* (2013.01); *H01L 29/4916* (2013.01); *H01L 29/66462* (2013.01); *H01L 29/66522* (2013.01); *H01L 29/7786* (2013.01); *H01L 29/2003* (2013.01); *H01L 29/205* (2013.01); *H01L 29/42316* (2013.01)

(58) Field of Classification Search
  CPC ............... H01L 29/42376; H01L 29/47; H01L 29/4916; H01L 29/2003; H01L 29/205
  USPC .......................................................... 257/194
  See application file for complete search history.

(56) References Cited

U.S. PATENT DOCUMENTS

| 2013/0193485 | A1  | 8/2013 | Akiyama et al. |
| 2014/0021513 | A1* | 1/2014 | Akiyama ............... H01L 21/324 257/194 |
| 2014/0061659 | A1* | 3/2014 | Teplik ................... H01L 29/402 257/76 |

FOREIGN PATENT DOCUMENTS

| EP | 2840593 A1   | 2/2015  |
| WO | 2014202409 A1 | 12/2014 |

* cited by examiner

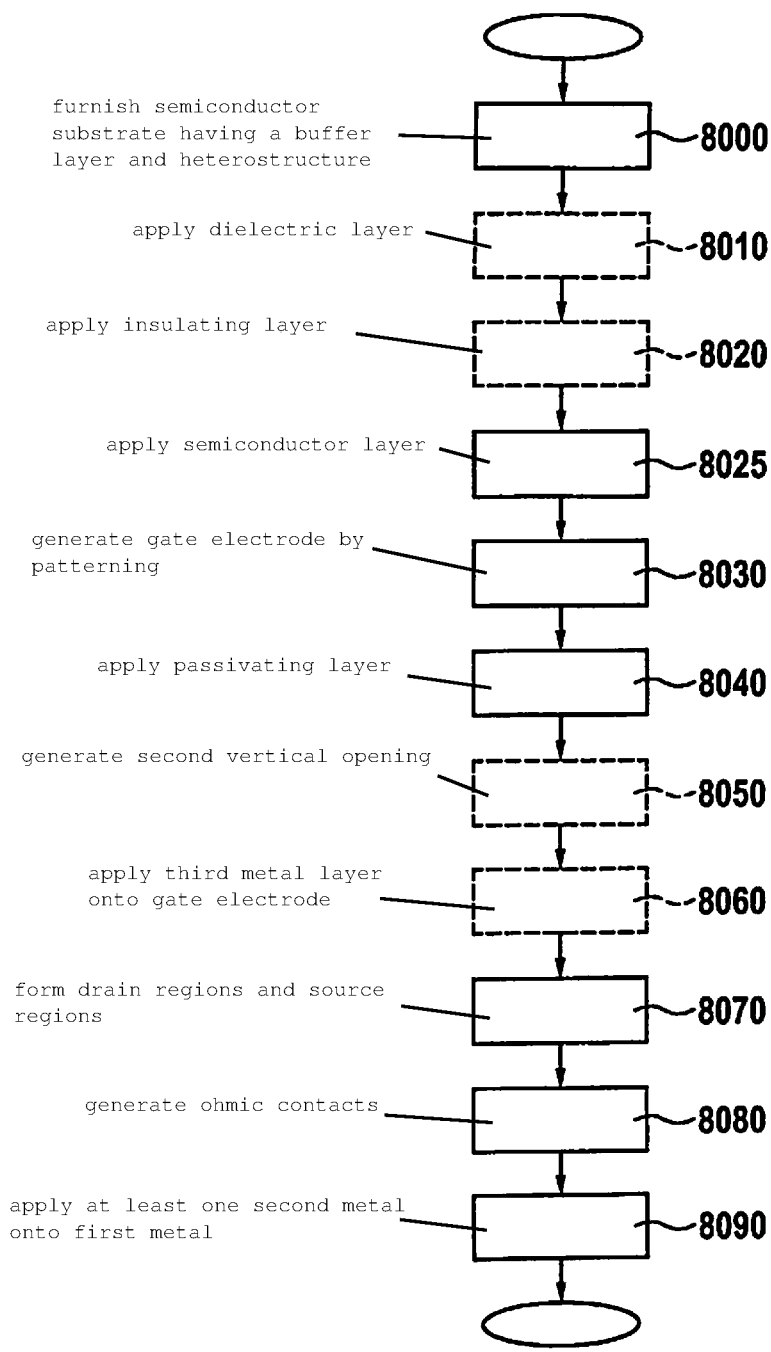

TRANSISTOR HAVING HIGH ELECTRON MOBILITY AND METHOD OF ITS MANUFACTURE

FIELD

The present invention relates to a method for manufacturing a transistor having high electron mobility, and to a transistor having high electron mobility.

BACKGROUND INFORMATION

Transistors having high electron mobility, for example HEMTs, are manufactured by epitaxial deposition of heterostructures such as AlGaN/GaN onto substrates made of sapphire, silicon carbide, and/or silicon. They are notable for a high charge carrier density in the channel region.

Conventionally, the gate electrode in HEMT transistors encompasses a Schottky contact, i.e., a metal-semiconductor transition. It is disadvantageous in this context that very high leakage currents occur at high voltages in the reverse state, and the component's losses are very high. It is furthermore disadvantageous that the maximum gate voltage is limited because the Schottky contact exhibits a very high leakage current as positive gate voltages become higher. The dynamic performance of the component is thereby impaired, and this can result in degradation and/or destruction of the component.

The maximum gate voltage can be raised by the fact that an insulating layer is disposed between the semiconductor layer (for example AlGaN) and the gate electrode so that a metal-insulated semiconductor contact is produced, with the result that the gate electrode of the HEMT transistor is insulated from the semiconductor layer. It is disadvantageous in this context, however, that both the interface from the semiconductor layer to the insulating layer and the interface from the insulating layer to the gate electrode, as well as the quality of the dielectric layer, are subject to stringent technological demands in terms of the dynamic performance and degradation of the component.

Two conventional methods, among others, are available for manufacturing an MIS gate transistor. In the first method, the ohmic contacts are manufactured earlier in time than the gate module, which has a gate dielectric and a gate electrode. Firstly ohmic contacts are generated, either before deposition of a passivating layer or after deposition of the passivating layer, by opening the passivating layer at the source and drain regions. This is followed by opening of the passivation at the gate region and optional deposition of gate dielectric, and obligatory deposition of gate metal. The gate electrode is then patterned, and further passivating and metallizing layers are generated.

It is disadvantageous in this context that metal-containing process steps are carried out before the gate module is manufactured, so that the gate dielectric in particular can become contaminated with metal, with the result that the performance of the transistor is considerably diminished.

In the second method, the ohmic contacts are generated later in time than the application of the gate dielectric. For this, a passivating layer is opened at the gate region and a gate dielectric is introduced into the opened region. The passivating layer is then opened at the source and drain regions, and the ohmic contacts are generated there. The gate electrode and further passivating and metallizing layers are then generated. Deposition of the gate dielectric thus occurs in metal-free sites.

It is nevertheless disadvantageous that the gate module can only be completed after manufacture of the ohmic contacts, and that because of a high temperature budget upon annealing of the ohmic contacts, the gate module exhibits interface degradation at the metal-dielectric surface.

An object of the present invention is to manufacture a robust gate contact.

SUMMARY

An example method according to the present invention for manufacturing a transistor having high electron mobility, having a substrate having a heterostructure, the substrate having in particular a III-V semiconductor, e.g. an AlGaN/GaN heterostructure, encompasses generation of a gate electrode by patterning a semiconductor layer that is applied onto the heterostructure. The semiconductor layer encompasses, in particular, polysilicon. In accordance with the operating principle, a two-dimensional electron gas forms in the heterostructure and functions as an electron channel for the transistor. The method according to the present invention furthermore encompasses application of a passivating layer onto the semiconductor layer, and formation of drain regions and source regions by generation of first vertical openings that extend at least into the heterostructure. In addition, ohmic contacts are generated in the drain regions and in the source regions by the fact that the first vertical openings are partly filled with a first metal, specifically at least to the height of the passivating layer. A second metal layer is furthermore applied onto the ohmic contacts, the second metal layer projecting beyond the passivating layer.

The advantage here is that the gate electrode is metal-free, with the result that it is robust with respect to high temperatures in the individual manufacturing steps.

In a further embodiment, an insulating layer is applied onto the heterostructure layer. The insulating layer is disposed between the heterostructure and the gate electrode, and functions as a gate insulator.

It is advantageous here that the permissible gate voltage is high. It is, in particular, in the range between 5 V and 15V, depending on the materials, the deposition method, and the thickness of the insulating layer.

In a refinement, a second vertical opening that extends as far as the surface of the semiconductor layer is generated in the region of the gate electrode.

The advantage here is that the gate electrode is electrically addressable from outside, and a further material can be directly deposited over the entire gate electrode.

In a further embodiment, the second vertical opening is filled with a third metal.

It is advantageous here is that the lead resistance to the gate electrode is improved, i.e., decreased. An additional field plate that, in particular, has a double-T shape can moreover be manufactured.

In a refinement, a dielectric layer that is disposed on the heterostructure is patterned. In other words, the dielectric layer is patterned in such a way that the shape of the gate electrode can be configured. The gate electrode can exhibit, for example, a regular T-shape or a T-structure having a symmetrical or asymmetrical field plate in the direction of the source region or drain region.

An advantage here is that the gate electrode is patternable.

The transistor having high electron mobility has a heterostructure. That heterostructure encompasses, in particular, AlGaN/GaN. The heterostructure is disposed on a semiconductor substrate and in accordance with the operating principle forms a two-dimensional electron gas within the heterostructure beneath the interface of the two layers. According to the present invention, a gate electrode of the transistor encompasses polysilicon.

It is advantageous here that the gate electrode is metal-free and the heterostructure does not become contaminated with metal, so that the performance of the transistor is enhanced.

In a further embodiment, the gate electrode is T-shaped.

An advantage here is that the breakdown voltage of the transistor is high.

Further advantages are evident from the description below of exemplifying embodiments, and from the figures.

BRIEF DESCRIPTION OF THE DRAWINGS

The present invention is explained below with reference to preferred embodiments and figures.

FIG. 8 depicts a method for manufacturing a transistor having high electron mobility.

DETAILED DESCRIPTION OF EXAMPLE EMBODIMENTS

Figure 1:
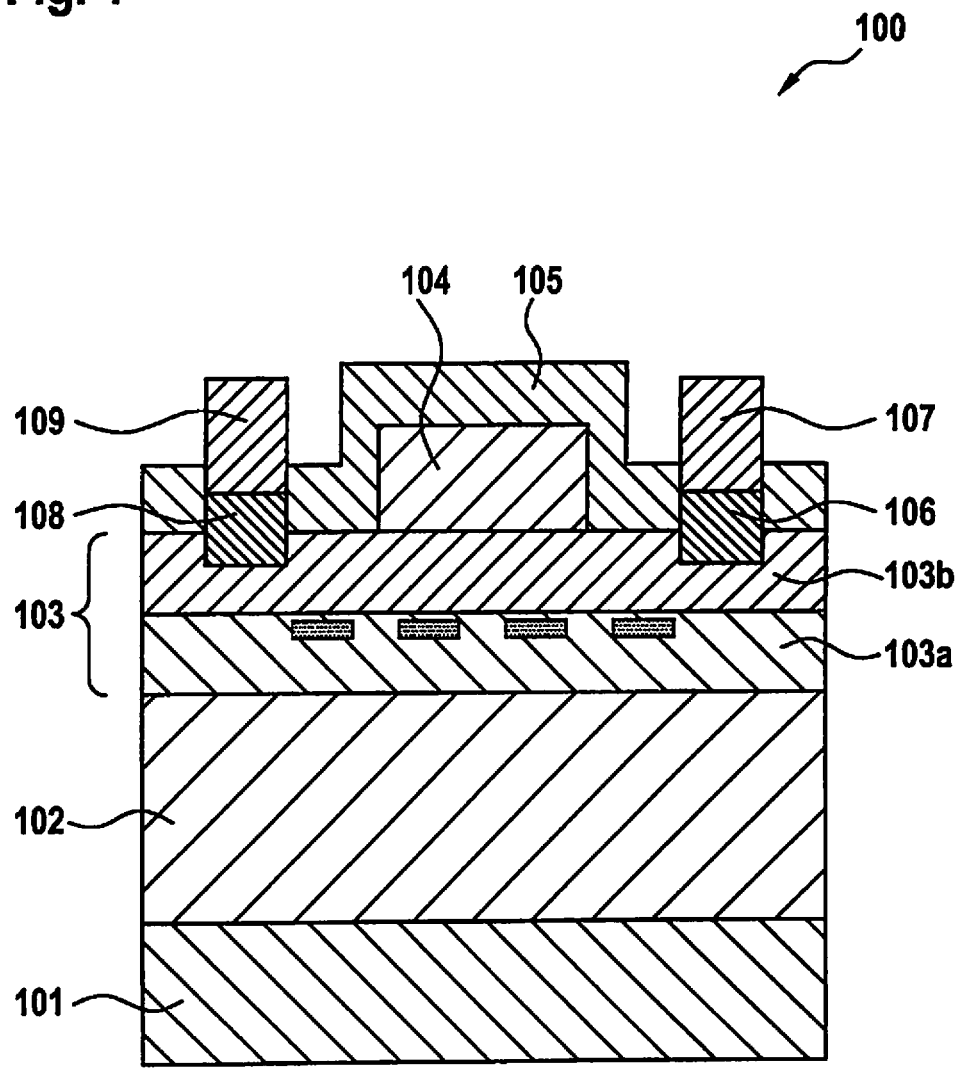
FIG. 1 is a sectioned depiction of a first example of a transistor having high electron mobility.

FIG. 1 is a depiction, sectioned in an X-Z direction, of a first example of an HEMT 100, i.e. a transistor having high electron mobility. HEMT 100 encompasses a semiconductor substrate 101 on which a buffer layer 102 is applied. A heterostructure 103 is disposed on buffer layer 102. The heterostructure encompasses two layers 103a and 103b. Upper layer 103b functions as a barrier layer. A two-dimensional electron gas forms spontaneously, in accordance with the operating principle, at the interface of the two layers 103a and 103b. The formation of the two-dimensional electron gas results in a high electron mobility at the interface, the electron mobility as a rule being greater than 1500 $cm^2/Vs$. This results in charge carrier densities in the electron channel of, as a rule, $n>10^{13}/cm^{-2}$, so that the conduction losses and switching losses of the transistor are very low. A gate electrode, which is produced by patterning a heavily doped semiconductor layer 104, is applied on heterostructure 103. A passivating layer 105 is applied onto the patterned heavily doped semiconductor layer 104, so that the gate electrode is passivated. Passivating layer 105 encompasses, for example, SiN 10 nm to 100 nm thick. The drain regions and source regions of HEMT 100 extend vertically as far as or into upper layer 103b of heterostructure 103. The drain regions and source regions each have an ohmic contact 106 and 108 that extends into passivating layer 105. A respective metallization 107 and 109, which functions as a power metallization, is applied onto ohmic contacts 106 and 108 so that the drain and source are externally contactable. The term "power metallization" is understood here as a metal layer, typically several micrometers thick and highly conductive, that transfers large electrical power levels to and from the transistor in as loss-free a manner as possible.

Figure 2:
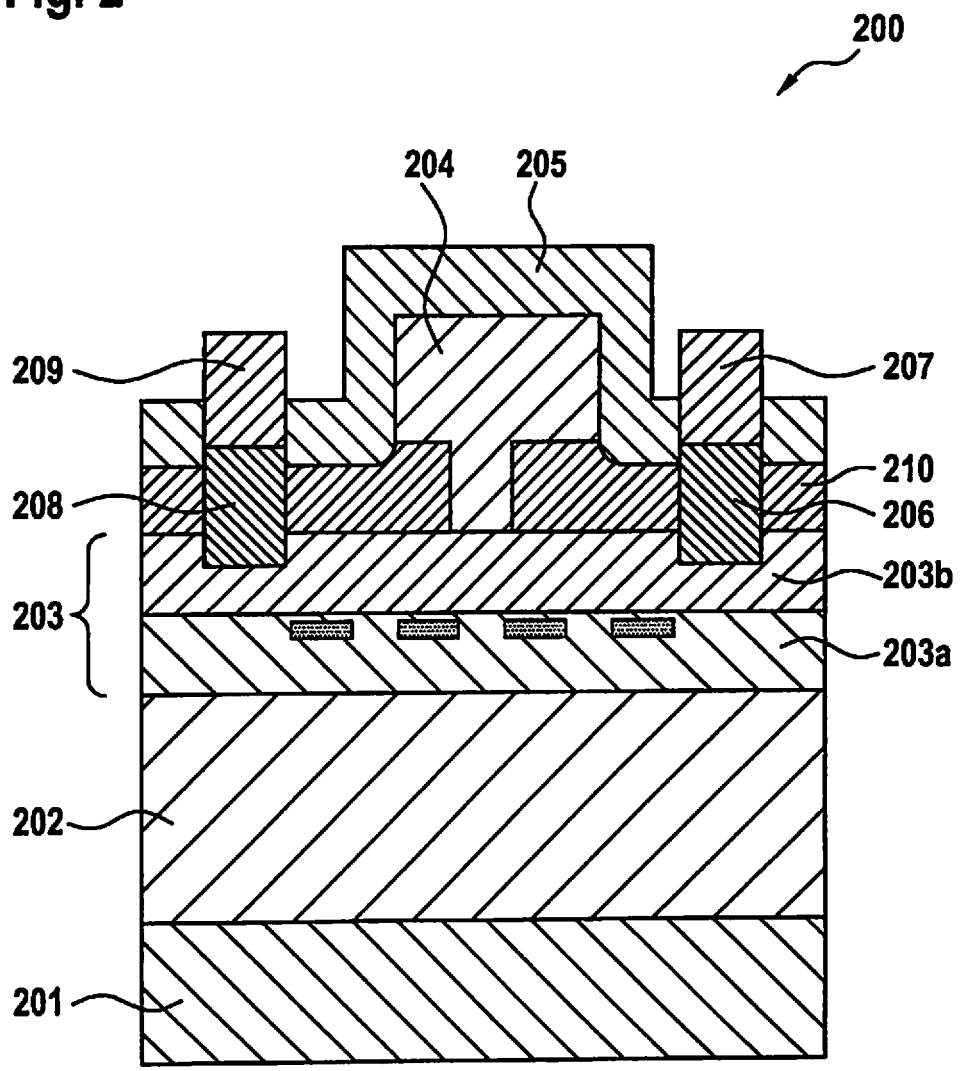
FIG. 2 is a sectioned depiction of a second example of a transistor having high electron mobility.

FIG. 2 is a depiction, sectioned in an X-Z direction, of a second example of HEMT 200. HEMT 200 has a semiconductor substrate 201 having a buffer layer 202 and a heterostructure 203. Applied onto heterostructure 203 is a dielectric layer 210 that allows the gate electrode to form in a vertical direction. A gate electrode that has field plates can thereby be generated. The field plates are, for example, at a vertical distance from heterostructure 203 which corresponds to the thickness of dielectric layer 210. The field plates can be disposed either symmetrically, in other words in a T-shape, or asymmetrically. Dielectric layer 210 encompasses, for example, silicon nitride, silicon dioxide, or aluminum oxide. Ohmic contacts 206 and 208 are disposed in the drain regions and source regions. As a result of dielectric layer 203, ohmic contacts 206 and 208 are taller than in the first example. Power metallizations 207 and 209 are disposed on the ohmic contacts.

Figure 3:
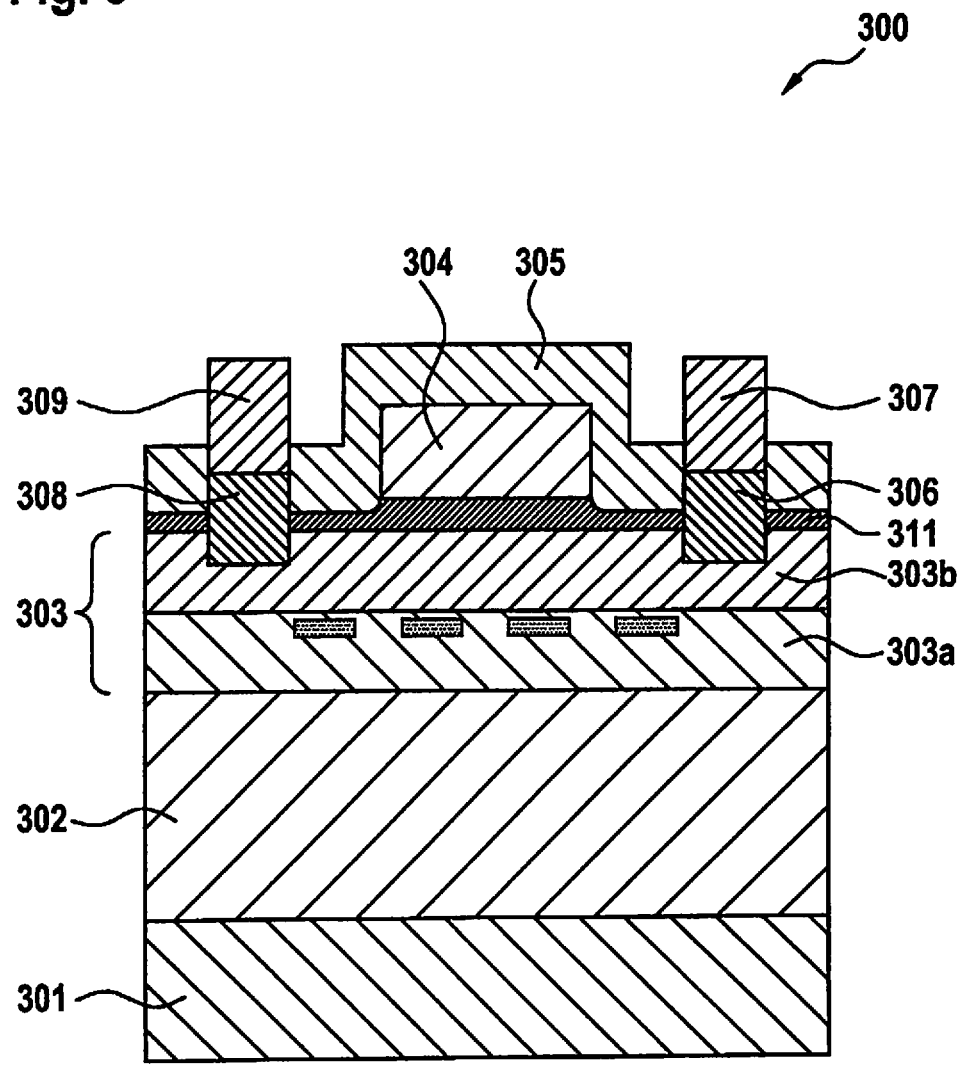
FIG. 3 is a sectioned depiction of a third example of a transistor having high electron mobility.

FIG. 3 is a depiction, sectioned in an X-Z direction, of a third example of an HEMT 300. HEMT 300 has a semiconductor substrate 301 having a buffer layer 302 and a heterostructure 303. An insulating layer 311 is disposed on heterostructure 303. The gate electrode is disposed on insulating layer 311 and is thus insulated from heterostructure 303 by insulating layer 311. The remainder of the structure is identical to that of FIG. 1, identical layers having the same final digits in the reference characters. Insulating layer 311 encompasses, for example, silicon nitride, silicon dioxide, or aluminum oxide.

In other words, an insulating layer that is removed in the source regions and drain regions is disposed on layer 303b. Metals are then deposited, i.e. ohmic contacts 306 and 308 in this case extend in any event into passivating layer 306, and it is also possible for them in fact also to rest at the edges on passivating layer 305 and to overlap. If the insulator is deposited only after the metals, the latter do not extend into the insulator. High heat is then applied so that the metal atoms of ohmic contacts 306 and 308 diffuse partly into upper layer 303b.

Figure 4:
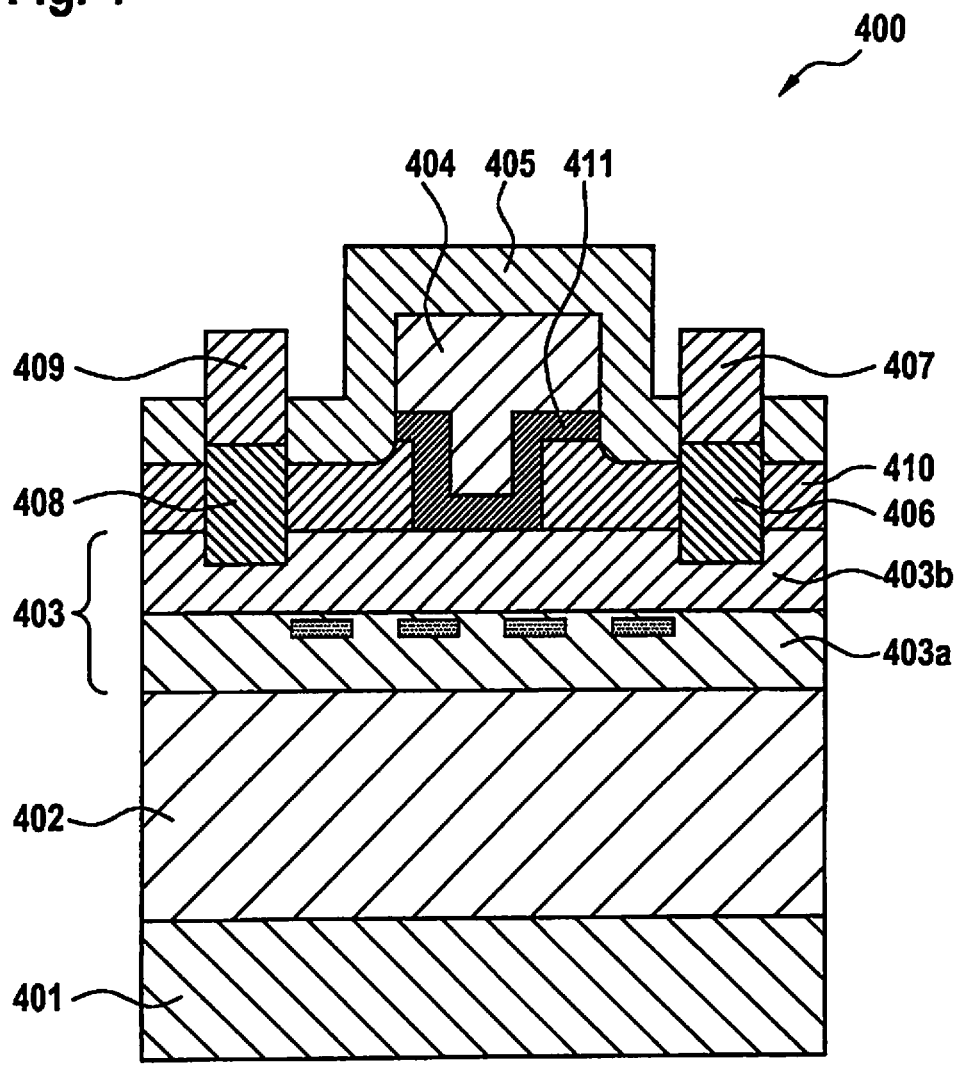
FIG. 4 is a sectioned depiction of a fourth example of a transistor having high electron mobility.

FIG. 4 is a depiction, sectioned in an X-Z direction, of a fourth example of an HEMT 400. HEMT 400 has a semiconductor substrate 401 having a buffer layer 402 and a heterostructure 403. A dielectric layer 410 is disposed on heterostructure 403. An insulating layer 411 is disposed on dielectric layer 410. Heavily doped semiconductor layer 404, from which the gate electrode is generated, is disposed on insulating layer 411. Passivating layer 405 is disposed on the patterned heavily doped semiconductor layer 404. The remainder of the structure is identical to the structure of FIG. 2. Here as well, identical layers have the same final digits for the reference characters.

Figure 5:
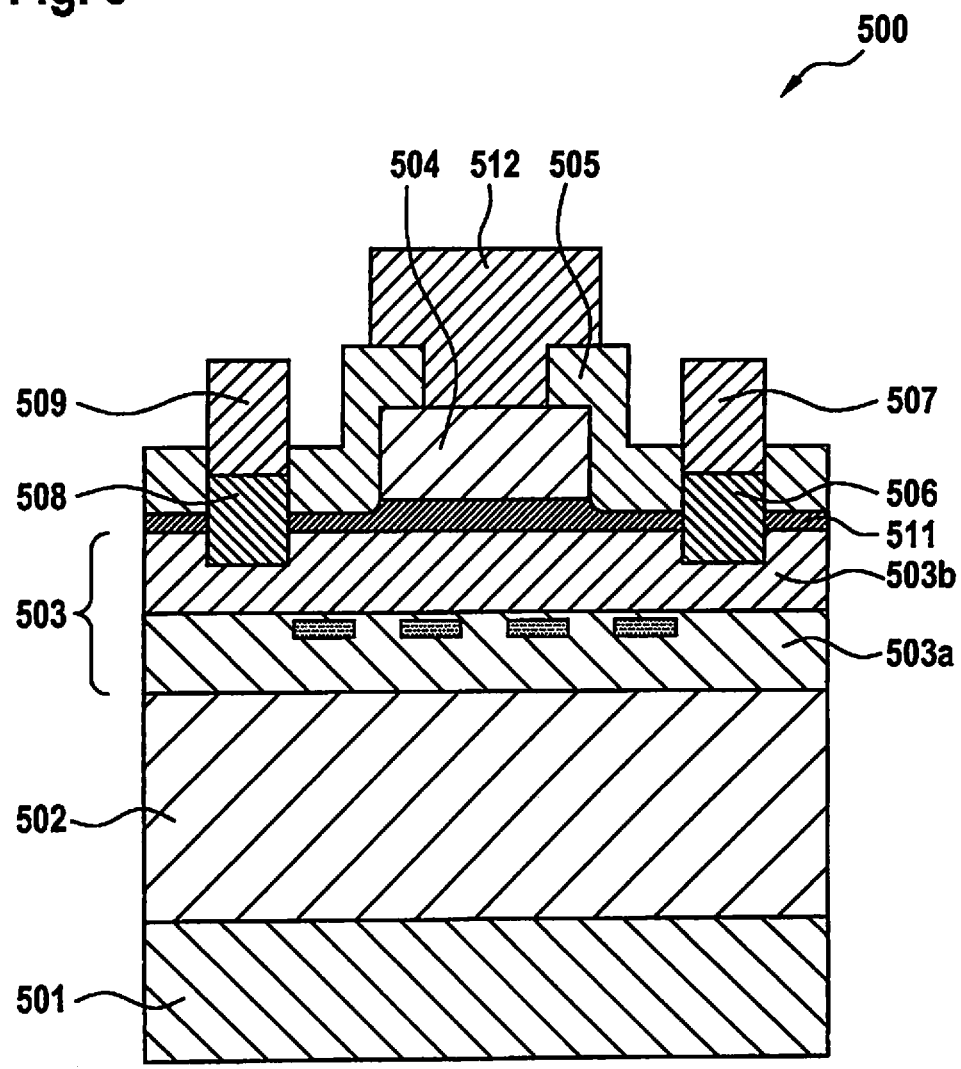
FIG. 5 is a sectioned depiction of a fifth example of a transistor having high electron mobility.

FIG. 5 is a depiction, sectioned in an X-Z direction, of a fifth example of HEMT 500. The structure of HEMT 500 encompasses the structure of HEMT 300 of FIG. 3. In addition, passivating layer 505 is opened in the gate region as far as heavily doped semiconductor layer 504, so that a third metal layer 512 is disposed in part on the gate electrode. This third metal layer 512 functions as a power metallization. The gate electrode is thereby directly accessible from outside, and thus externally contactable.

Figure 6:
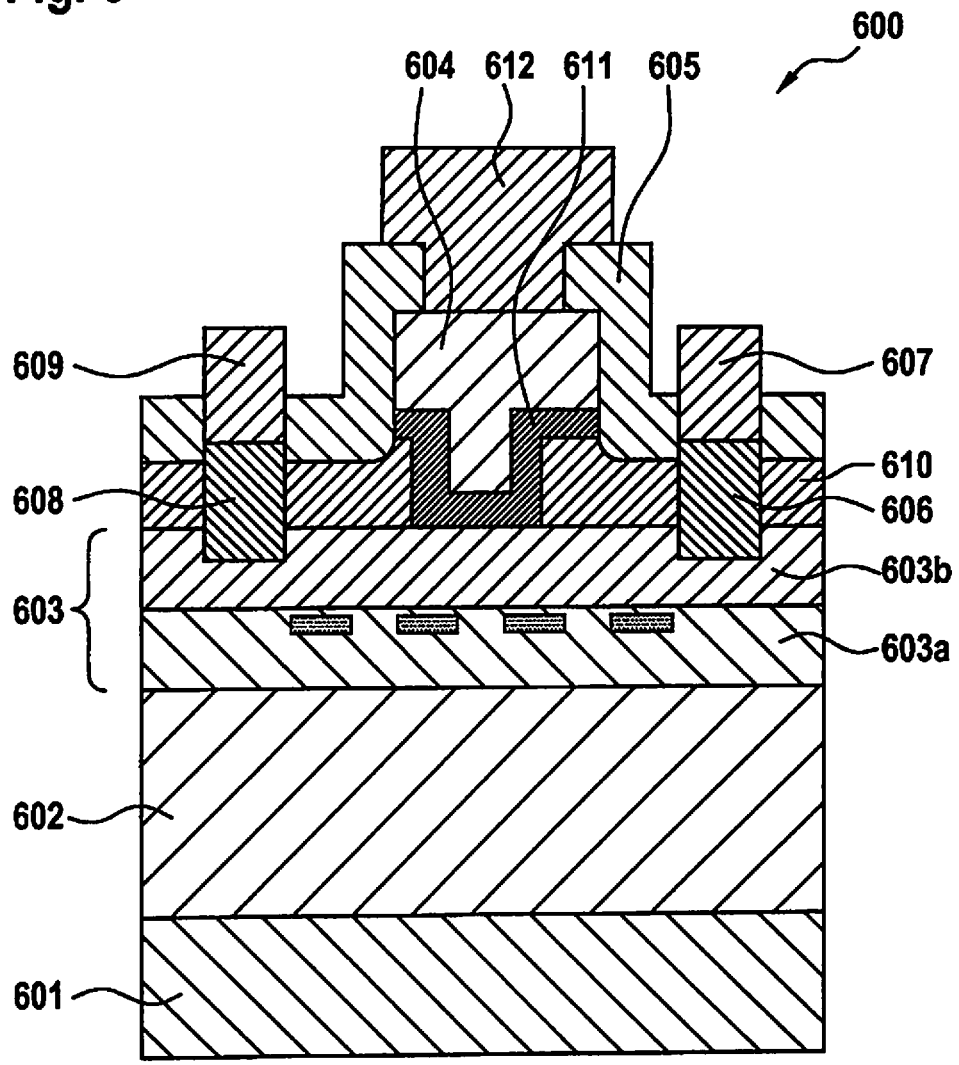
FIG. 6 is a sectioned depiction of a sixth example of a transistor having high electron mobility.

FIG. 6 is a depiction, sectioned in an X-Z direction, of a sixth example of HEMT 600. The structure of HEMT 600 encompasses the structure of HEMT 400 of FIG. 4. In addition, passivating layer 605 is opened in the gate region as far as heavily doped semiconductor layer 604, a third metal layer 612 being disposed in part on the gate electrode.

Figure 7:
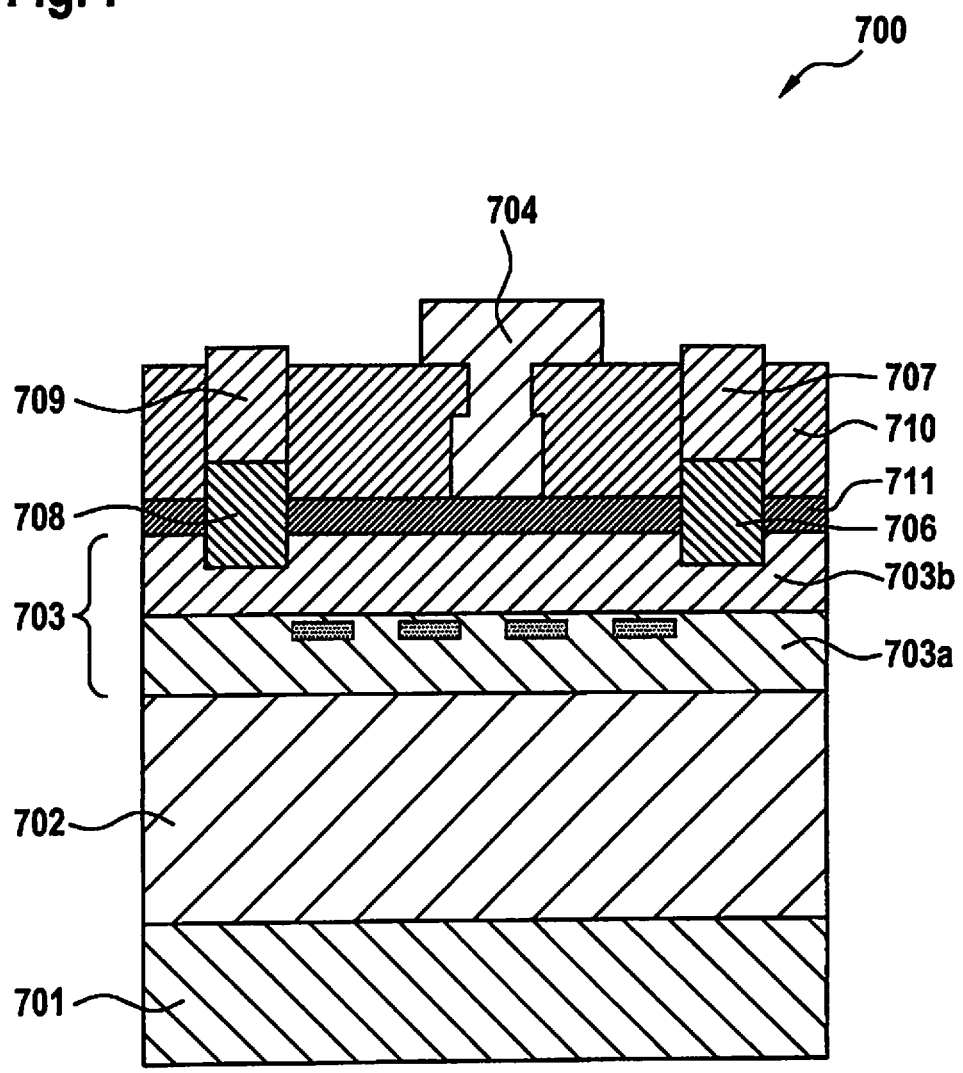
FIG. 7 is a sectioned depiction of a seventh example of a transistor having high electron mobility.

FIG. 7 is a depiction, sectioned in an X-Z direction, of a seventh example of HEMT 700. HEMT 700 has a semiconductor substrate 701 having a buffer layer 702 and a heterostructure 703. Insulating layer 711 is disposed on heterostructure 703. Dielectric layer 710 is disposed on insulating layer 711. The gate electrode is disposed on insulating layer 711 and is shaped vertically by the dielectric layer. The drain regions and source regions have ohmic contacts 706 and 708, as well as power metallization 707 and 709.

Semiconductor substrate 101, 201, 301, 401, 501, 601, and 701 encompasses, for example, silicon, silicon carbide, or sapphire.

Heterostructure 103, 203, 303, 403, 503, 603, and 703 encompasses, for example, AlGaN and GaN or AlN and GaN or InGaN and AlGaN or InGaN and GaN.

In all the examples described, semiconductor layer 104, 204, 304, 404, 504, 604, and 704 is heavily doped. The term "heavily doped" is understood here as a doping of more than $10^{17}$ cm$^{-3}$. Semiconductor layer 104, 204, 304, 404, 504, 604, and 704 encompasses, for example, polysilicon. Other semiconductor materials, such as Ge, are also alternatively conceivable.

In an exemplifying embodiment, heavily doped semiconductor layer 104 is made of polysilicon.

In HEMTs 100, 300, and 500 of the first, third, and fifth examples, the inception voltage of the transistor can be adjusted by way of the doping of the semiconductor layer. The term "inception voltage" is understood here as the gate voltage at which the transistor switches over from reverse into forward operating mode.

FIG. 8 shows the method for manufacturing a transistor having high electron mobility. It refers, in particular, to III-V power transistors. The method starts with step 8000, a semiconductor substrate having a buffer layer and a heterostructure being furnished. The buffer layer is disposed directly on the semiconductor substrate, and the heterostructure directly on the buffer layer. This initial substrate, encompassing the semiconductor substrate, buffer layer, and heterostructure, can optionally have a cap layer, made, e.g., of p-doped gallium nitride. The buffer layer encompasses, for example, unintentionally doped GaN. In a subsequent step 8025, a semiconductor layer is applied onto the heterostructure, for example using a chemical vapor deposition process. This semiconductor layer is heavily doped. It encompasses, for example, polysilicon. In a subsequent step 8030 a gate electrode is generated by patterning the semiconductor layer, for example by wet-chemical or dry-chemical etching. In a subsequent step 8040 a passivating layer is applied onto the patterned semiconductor layer and the gate electrode. The passivating layer encompasses SiN, SiO2, or Al2O3. In a subsequent step 8070, drain regions and source regions are formed. For this, vertical openings from the topmost layer (in this example, the passivating layer) to the heterostructure are generated. The vertical openings are generated by selective etching. In a subsequent step 8080, ohmic contacts are generated in the drain regions and in the source regions. For this, the first vertical openings are partly filled with a first metal up to a height of the passivating layer. The first metal is, for example, nickel or copper. In a subsequent step 8090 at least one second metal is applied onto the first metal in the form of a metal layer. The second metal encompasses, for example, Al or Cu or Au. The second metal can also encompass a copper alloy. This means that the ohmic contacts are usually manufactured from several metals that are disposed one above another and then heated. The metal-layer stack typically encompasses Ti/Ni/Al/Au, Ti being disposed on or in top layer 103b. Alternatively, a Ti/Ni/Ti/Au metal-layer stack, or a gold-free contact having Ti/TiN or Ti/Al, is used.

In an optional step 8010 that occurs between step 8000 and step 8025, a dielectric layer is applied onto the heterostructure. The dielectric layer is applied directly onto the heterostructure. It is thus located between the heterostructure and the passivating layer. In this example, in addition to the passivating layer the dielectric layer must also be removed locally in order to form the first vertical openings.

In an optional step 8020 that occurs before step 8025 or between the optional step 8010 and step 8025, an insulating layer is applied onto the heterostructure. The application is accomplished, for example, by in-situ deposition of SiN or ex-situ deposition of SiN, SiO$_2$, or Al$_2$O$_3$. The insulating layer is applied directly onto the heterostructure, or is disposed between the dielectric layer and the passivating layer. It is thus located between the heterostructure and the passivating layer. The insulating layer serves here for gate insulation. In this example, in addition to the passivating layer, the insulating layer, or the insulating layer and the dielectric layer, must also be locally removed in order to form the first vertical openings.

In an optional step 8050 that occurs between steps 8040 and 8070, a second vertical opening is generated in the region of the gate electrode. This second vertical opening extends as far as the surface of the patterned semiconductor electrode or of the gate electrode, which simultaneously functions as an etch stop. In a subsequent optional step 8060, which is carried out only if optional step 8050 has been carried out, a third metal is applied onto the gate electrode in the form of a metal layer. The third metal encompasses the same material as the second metal. Alternatively, the third metal encompasses aluminum.

The transistors can be utilized in power electronics converters, for example in hybrid or electric vehicles, and in the field of photovoltaics in order to implement inverter systems.

What is claimed is:

1. A method for manufacturing a transistor having high electron mobility, encompassing a substrate having an AlGaN/GaN heterostructure, comprising:
    generating a gate electrode by patterning a semiconductor layer that is applied directly or indirectly onto the heterostructure, the semiconductor layer encompassing polysilicon;
    applying a passivating layer onto the semiconductor layer;
    forming drain and source regions by generating first vertical openings that extend at least into the heterostructure;
    generating ohmic contacts in the drain regions and in the source regions by partly filling the first vertical openings with a first metal from in the heterostructure into the passivating layer, forming respective top surfaces in the passivating layer; and
    applying respective second metal layers onto the top surfaces of the ohmic contacts in the passivating layer, the second metal layer projecting upward, through and beyond a top of the passivating layer.

2. The method as recited in claim 1, further comprising:
    applying an insulating layer onto the heterostructure, the insulating layer being disposed between the heterostructure and the passivating layer, the insulating layer functioning as a gate insulator.

3. The method as recited in claim 1, further comprising:
generating a second vertical opening in the region of the gate electrodes, which extends as far as a surface of the semiconductor layer; and
applying a third metal layer onto the gate electrode.

4. The method as recited in claim 1, further comprising:
patterning a dielectric layer that is disposed on the heterostructure to pattern the gate electrode.

5. The method as recited in claim 1, further comprising:
applying an insulating layer onto the heterostructure, the insulating layer being disposed between the heterostructure and the semiconductor layer, made of polysilicon, which functions as a gate electrode, the insulating layer functioning as a gate insulator.

6. A transistor having high electron mobility, the transistor comprising:
an AlGaN/GaN heterostructure;
a polysilicon gate electrode directly or indirectly on the heterostructure;
a passivating layer partially on at least a part of the semiconductor layer;
a drain region including:
a first metal as a first ohmic contact extending from in the heterostructure into the passivating layer, with a first top surface in the passivating layer; and
a second metal extending upward from the first top surface in the passivating layer through and beyond a top of the passivating layer; and
a source region including:
the first metal as a second ohmic contact extending from in the heterostructure into the passivating layer, with a second top surface in the passivating layer; and
the second metal extending upward from the second top surface in the passivating layer through and beyond the top of the passivating layer.

7. The transistor as recited in claim 6, wherein the gate electrode is T-shaped.

8. The transistor as recited in claim 6, wherein the gate electrode is metal free.

9. The transistor as recited in claim 6, further comprising a dielectric layer below a first part of the gate electrode, wherein a second part of the gate electrode extends downwards into the dielectric layer, the second part being positioned asymmetrically relative to the first part of the gate electrode, closer to one of the drain and source regions than the other of the drain and source regions.

10. The transistor as recited in claim 9, further comprising an insulating layer separating a bottom of the second part of the gate electrode from the heterostructure.

11. The transistor as recited in claim 10, wherein the insulating layer extends from over a top surface of the dielectric layer downward into the dielectric layer, reaching the heterostructure.

12. The transistor as recited in claim 6, further comprising an insulating layer on the heterostructure layer, separating between the heterostructure layer and (a) the gate electrode, which is arranged on the insulating layer, and (b) a part of the passivating layer arranged on the insulating layer.

13. The transistor as recited in claim 12, wherein a part of the gate electrode is arranged on a top surface of the passivating layer.

* * * * *